United States Patent [19]

Fry

[11] Patent Number: 5,173,693
[45] Date of Patent: Dec. 22, 1992

[54] POSITION ENCODER USING A PSEUDO-RANDOM CODING SEQUENCE

[75] Inventor: Richard L. Fry, Cambridge, United Kingdom

[73] Assignee: Haseltine Lake & Co., United Kingdom

[21] Appl. No.: 536,678

[22] PCT Filed: Nov. 7, 1989

[86] PCT No.: PCT/GB89/01327
§ 371 Date: Sep. 6, 1990
§ 102(e) Date: Sep. 6, 1990

[87] PCT Pub. No.: WO90/05414
PCT Pub. Date: May 17, 1990

[30] Foreign Application Priority Data

Nov. 8, 1988 [GB] United Kingdom ............... 8826114

[51] Int. Cl.$^5$ ............................................ H03M 1/00
[52] U.S. Cl. ........................................ 341/15; 341/11; 341/9
[58] Field of Search ..................... 341/6, 7, 8, 9, 10, 341/11, 13, 14, 15

[56] References Cited

U.S. PATENT DOCUMENTS

| | | | |
|---|---|---|---|
| 3,882,482 | 5/1975 | Green et al. | 341/13 X |
| 4,572,952 | 2/1986 | March | 341/13 X |
| 4,628,298 | 12/1986 | Hafle et al. | 341/13 |
| 4,631,519 | 12/1986 | Johnston | 341/13 |
| 4,780,600 | 10/1988 | Johnston | 341/14 X |
| 4,906,992 | 3/1990 | Wingate et al. | 341/13 X |
| 4,914,437 | 4/1990 | Kibrick et al. | 341/13 X |
| 4,947,166 | 8/1990 | Wingate et al. | 341/13 |
| 4,965,503 | 10/1990 | Watanabe et al. | 341/13 |

OTHER PUBLICATIONS

New Pseudorandom Encoding Technique for Shaft Encoders With Any Desired Resolution, Electronic Letters, vol. 23, No. 10, May 7, 1987 (Hitchin, Herts, GB) pp. 507-509.

Primary Examiner—Howard L. Williams
Attorney, Agent, or Firm—Reed Smith Shaw & McClay

[57] ABSTRACT

Two fragments from a single maximal length sequence of length $2^{(x/2)} - 1$ are interleaved to produce a new sequence of bits. The lengths of the fragments are such that they have no common factors. Each x-tuple of successive bits of the new sequence of bits uniquely defines the absolute position of that x-tuple in the sequence of bits, which position may be obtained from the relative position in the fragments of two y-tuples making up the x-tuple.

21 Claims, 5 Drawing Sheets

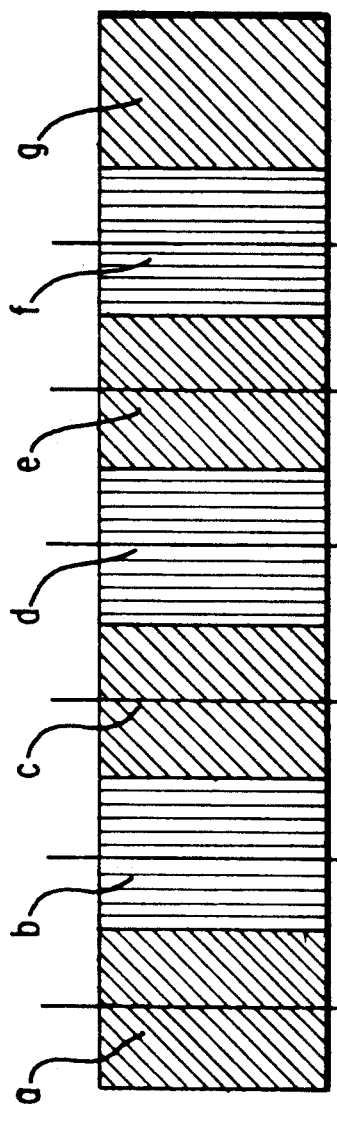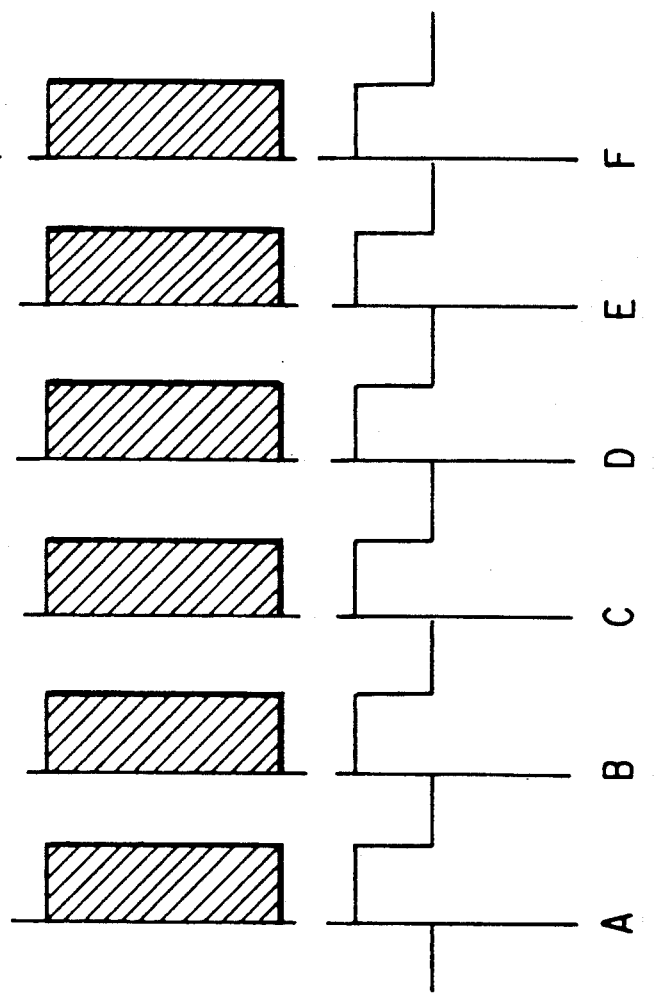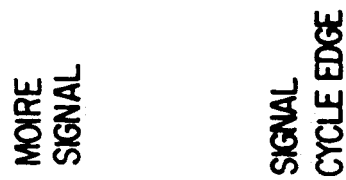

POSITION ENCODER USING A PSEUDO-RANDOM CODING SEQUENCE

This invention relates to the decoding of random or pseudo-random sequences and is applicable, for example, to absolute position encoders.

It is possible to use a maximal length binary sequence (called an m-sequence) in an absolute position encoder. An m-sequence is a sequence of $2^n-1$ bits so arranged that all of the n-tuple groups of successive bits are unique. If the sequence is considered to be circular, there are then $2^n-1$ unique n-tuples. The bit pattern of each n-tuple thus defines its position in the m-sequence. It is thus possible to make an absolute encoder in which the limit of physical resolution is one bit of the m-sequence. This is particularly useful for optical and high precision encoders where the physical resolution precludes the use of more than a single optical track. Unfortunately, one feature of the m-sequence is that it is pseudo-random and there is no simple relationship between any n-tuple and its position in the sequence. In practice it is possible to determine the position of any given n-tuple by, for example, either:

1. Stepping through the sequence from the position to be determined until a known reference point, usually all 1's, is found; or
2. Creating a look-up table in which the absolute position of every n-tuple is written.

Both of these techniques can be used if the coefficients of the generating polynomial are known, as they are in an encoder application. However, the first introduces a processing delay between an n-tuple being presented and an absolute position being available and although the second approach is faster it does require storage memory. Both approaches become unattractive when long sequences such as for $n>20$ are used when, for example, approach (1) could require stepping through upto $2^n-1$ n-tuples to find the match and approach (2) requires a look-up table of $>1M\times20$ bits.

According to one aspect, the invention involves interleaving fragments, e.g. two fragments, of the same maximal length sequence, where the fragments have lengths with no common factors.

This allows the above two approaches to be used more economically in, for example, absolute encoders.

According to a second aspect of the invention there is provided a device having a sequence of bits characterised in that said sequence of bits comprises a plurality of different interleaved fragments of a single maximal length sequence, said fragments having lengths with no common factors such that there exists integer x whereby any x-tuple of x successive bits of the sequence of bits defines an absolute location in the sequence.

For example, one may use two fragments only, with a maximal length sequence of length of $2^{X/2}-1$.

According to a third aspect of the invention there is provided a device having a sequence of machine readable bits characterised in that, for a given integer x, in any x-tuple of x successive bits of said sequence, different bits of the x-tuple form a set of y-tuples together uniquely defining the position of the x-tuple in the sequence, each x-tuple being unique but each y-tuple occurring more than once in different x-tuples.

This may be easily and generally achieved where the fragments differ in length by 1. In one example, to replace a sequence of order n (where n is even) one would generate a sequence of order $(n/2+1)$ (i.e. length $2^{(n/2+1)}-1$) and break this into fragments of length $2^{n/2}$ and $2^{n/2}-1$.

According to a fourth aspect of the invention there is provided a method of determining an absolute location characterised by the steps of:

breaking a maximal length sequence into a plurality of fragments having lengths with no common factors;

interleaving said fragments to form a new sequence for which there exists an integer x for which any x-tuple of x successive bits of the new sequence defines an absolute location in the new sequence;

reading an x-tuple of said new sequence; and calculating from said x-tuple an absolute position.

According to a fifth aspect of the invention there is provided a method of preparing a coding sequence characterised by the steps of:

breaking a maximal length sequence into a plurality of fragments having lengths with no common factors; and interleaving said fragments to form said coded sequence.

For a better understanding of the present invention and as to how the same may be carried into effect, reference will now be made, by way of example, to the accompanying drawings in which:

FIG. 4A shows an interleaved code;

FIG. 4B shows a Moire track;

FIG. 4C shows a Moire signal resulting from the Moire track of FIG. 4B;

Relating to an example of the case above of an encoder with 20 bits resolution (i.e. 1 bit in $2^{20}-1$ bits), this example uses an m-sequence of order $(20/2)+1$, i.e. 11 (i.e. 2047 bits long). This sequence is broken into two fragments of length 1024 and 1023. Note that each 11-tuple still appears only once in the sequence and only in the A or B fragment, never both. Any m-sequence can be broken into two such fragments with a length difference of 1, but the exact position in which it can be broken while preserving the required properties is best found by exhaustive searching using a computer.

These two fragments A and B are then interleaved bit by bit (see FIG. 1) to create a new sequence of length $1024\times1023\times2$ in which each 22-tuple is unique. More generally this sequence is now greater than $2^n$ bits long $$(2\times2^{n/2}\times(2^{n/2}-1))=2^{n+1}-2^{n/2+1}$$

in fact nearly $2^{n+1}$.

Note that this is not now a maximal length sequence.

Figure 1:
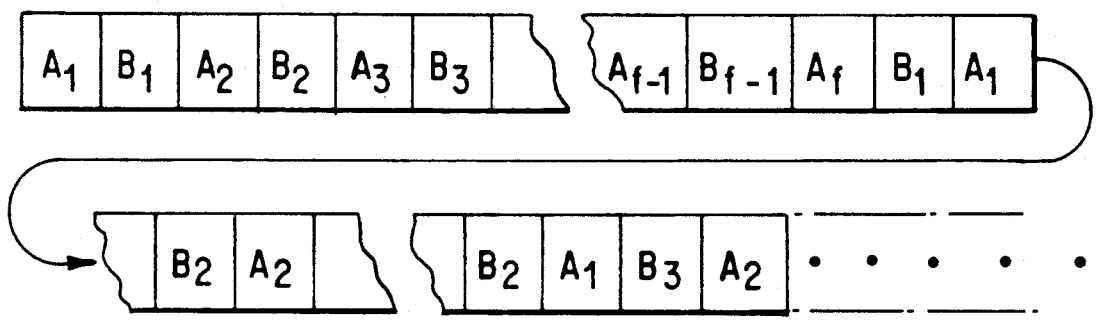
FIG. 1 shows an interleaved pseudo random code.

In more detail, each fragment is repeated an appropriate number of times. Thus if the A fragment consists of the bits $A_1, A_2 \ldots A_f$ and the B fragment consists of the bits $B_1, B_2 \ldots B_{f-1}$, then after interleaving sequences of these fragments to give $2(1024.1023)$ bits, the bit sequence of the encoder is as shown in FIG. 1.

If the A and B sequences were not separate fragments of one m-sequence, then a decoder would need to have some way of determining the phase of the two streams.

In the scheme proposed a decoder itself can determine the phase by seeing from which fragment A or B a particular 11-tuple has come.

This allows an encoder to be implemented with one code bit per physical resolution and the only penalty over the conventional approach is to input an n-tuple of 2 extra bits in length i.e. 22 bits instead of 20 or 21.

Figure 2:
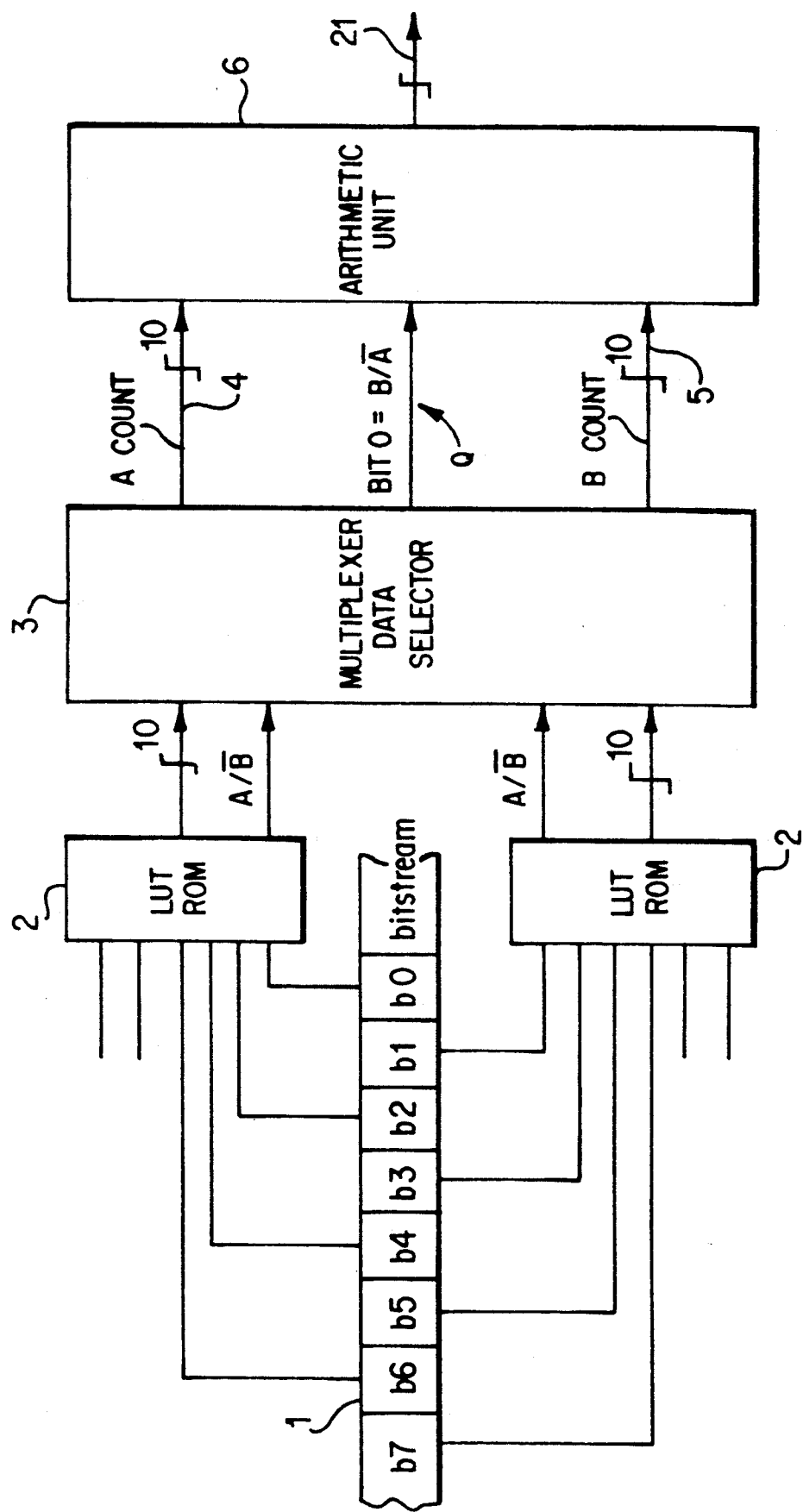
FIG. 2 shows a circuit arrangement for decoding the code of FIG. 1.

A practical implementation of this is shown in FIG. 2. Again for illustration an encoder with two fragments of an 11 bit code is used.

In operation, the 22 bit code sequence is presented from a reading (optical) head to a first-in-first out shift register 1 of decoder electronics and the two interleaved 11 bit fragments extracted and presented to look up table ROMs 2. (These could be replaced by a counter scheme as mentioned earlier, or by a single ROM multiplexed between the two streams and latched). The ROM outputs define which fragment the 11-tuples come from (A or B) and their absolute positions within the fragments. A multiplexer 3 channels the A and B counts to A and B count outputs 4 and 5 and provides a further output Q defining the fragment from which bit 0 of the shift register comes. A simple arithmetic operation is then performed by arithmetic unit 6 to generate the absolute position (count) of the 22-tuple based on the fact that the A fragments precess relative to the B fragments. absolute Position=

$$2\times[[(A'-B'-Q)_{MOD\ B}]\times MOD\ A+A']-Q$$

where Q=0 when bit 0 of the n-tuple is from the A fragment and Q=1 when bit 0 of the n-tuple is from the B fragment A' and B' designate the counts, or positions, found within the A and B fragments and A and B represent the lengths of the A and B fragments respectively.

In this case if B=1024 and A=1023 the arithmetic operations become simple shifts, additions and subtractions which can be performed in almost any processor, in discrete logic circuits or in a custom designed integrated circuit according to the cost and performance required.

The 1M×20 bit memory is now reduced to 2×2K×11 bit memories 2 and some logic. The technique can be applied to any length of sequence although the longer the sequence the greater the benefit.

A complete system will now be described with reference to FIGS. 3 to 6.

The system 10 comprises a movement control system 12 together with an optical encoder arrangement 14 based on the principles described above.

There are various known movement control systems and in the embodiment shown a numerical tool control system is indicated. It will be obvious to a man skilled in the art that any other suitable control system could replace that shown in FIG. 3.

Figure 3:
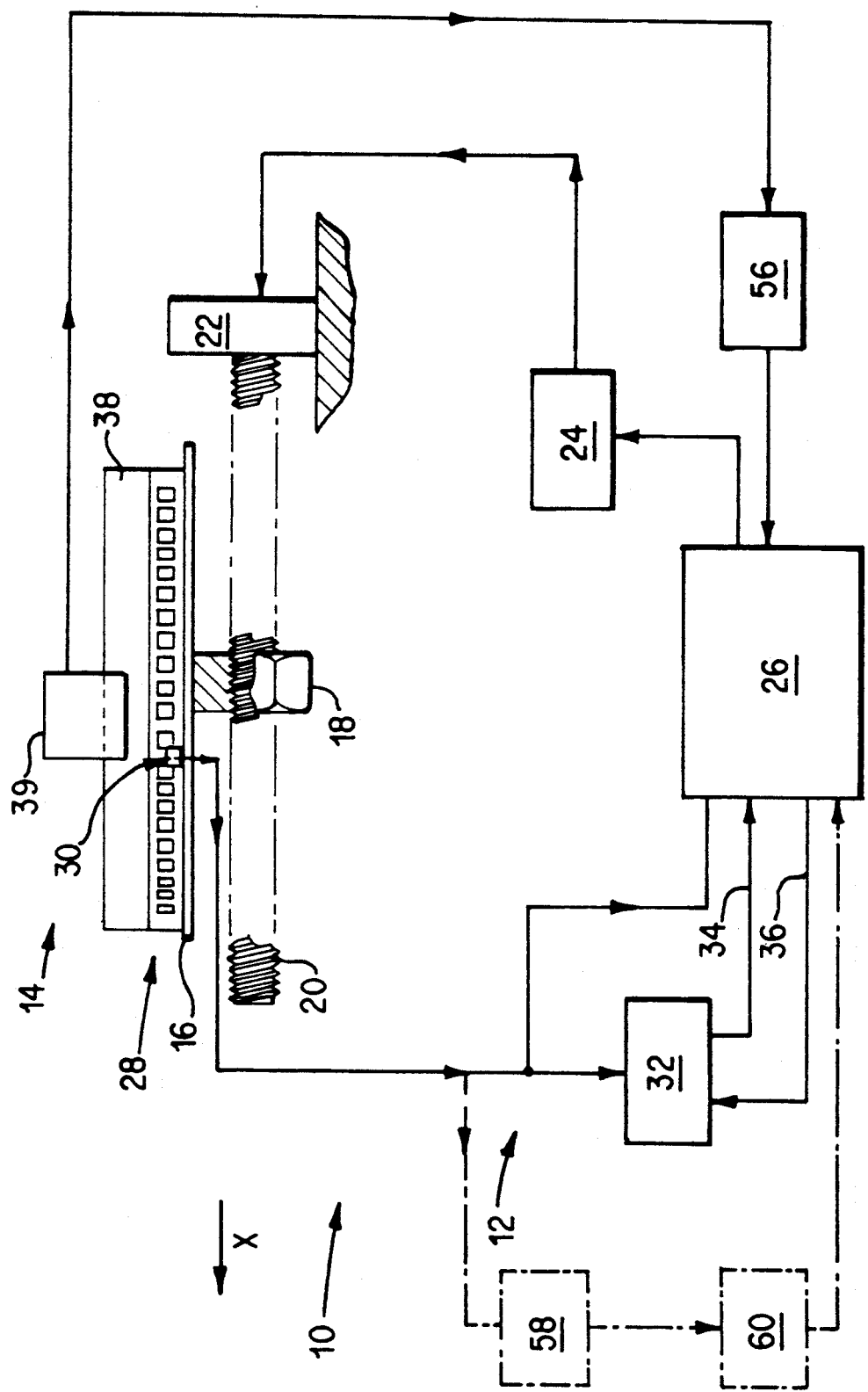
FIG. 3 shows an encoder arrangement embodying the present invention.

The numerical tool movement control system includes a translation table 16 mounted on guides to be movable in the x-direction (right to left in FIG. 3). The table 16 carries a nut 18 which threadably engages a rotatable, linear, lead screw 20. A stepper motor 22 is coupled to drive the lead screw 20 and is controlled, via a stepper amplifier 24, by pulses emitted from a microprocessor 26. The translation table 16 supports a linear Moire strip 28, the tracks of which are formed by alternate black and white areas as shown in FIG. 4B. These tracks are read by a stationary Moire reader 30, of known construction, which sends a Moire signal, as shown in FIG. 4C, to a counter 32 and also directly to the microprocessor 26. When the reader 30 dectects a transition from a white to a black area of the Moire track, the reader 30 produces a positive-going signal, i.e. the leading edge of the resulting Moire signal. A counter value output 34 and a counter reset input 36 are coupled to the microprocessor 26.

The position of the table 16 is approximately known as a program in the microprocessor 26 caused a desired, known number of pulses to be sent to the stepper motor 22, the number of these pulses corresponding to the desired distance to be moved. As the translation table 16 moves, the Moire signal produced by the reader 30 from the Moire track is sent to the counter 32. The counter 32 is incremented on every positive-going transition of the Moire signal and thus provides a check on the distance moved. The resulting system is thus a conventional closed-loop movement control system for computer control of the table 16.

With the optical encoder arrangement 14 as described hereinafter, an absolute position can be determined for more precise control. For this purpose, the translation table 16 supports a chrome on glass strip 38 carrying a pseudo random code (PRC) such as discussed hereinbefore. The code is in the form of a continuous sequence of bits, each bit being represented either by the absence ("0") or presence ("1") of a chrome zone. FIG. 4A illustrates, by different shading, the two zones occupied by the bits of the two interleaved fragments of a single m-sequence, with zones a,c,e etc. representing one fragment and zones b,d,f etc, the other fragment.

Figure 5:
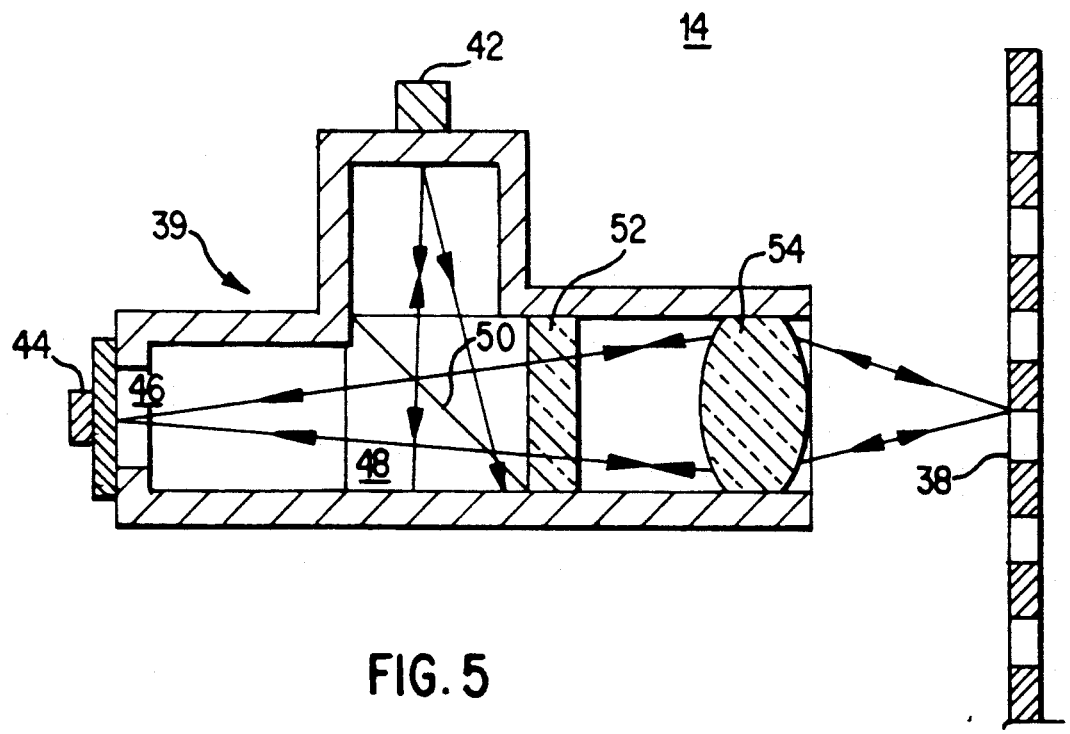
FIG. 5 shows an optical arrangement of FIG. 3.

An optical reading arrangement 39 for scanning the PRC strip 38 will now be discussed with reference to FIG. 5. The arrangement is supported in a case 40 having a light absorbing lining and comprises an LED 42, a photosensitive detector 44, a slit 46 providing an optical aperture for the detector, a cube beam splitter 48 (i.e. two 45 degree prisms arranged to form a cube and having a metal or dielectric coating at their interface 50), a cylindrical lens 52 and a convex lens 54. Light emitted by the LED 42 is reflected by the beam splitter 48 in the direction towards the cylindrical and convex lenses, 52 and 54 respectively. This light is focused by the lenses 52 and 54 onto the strip 38. Light transmitted straight through the beam splitter 48 from the LED 42 is substantially absorbed by the casing 40. If the bit being examined is represented by a glass zone which transmits most of the incident light, there is no significant reflection and the detector 44 receives substantially no light. This indicates that the bit value is "0". If the bit being examined is represented by a chrome zone, then light is reflected back through the lenses 52 and 54, onto the beam splitter 48 where it is transmitted straight through to impinge on the detector 44. The detector 44 is stimulated by the light received, which signifies that the bit value is "1". The optical arrangment remains fixed whilst the PRC strip 38 moves relative to it and the arrangement is constructed so that light from the LED 42 is focused on to one bit at a time to cause an image of that single bit to be formed at the detector 44. It is alternatively possible to read several bits of the code at once by, for example, using an array of detectors.

The detector 44 is coupled to the microprocessor 26 via a signal amplifier 56 and the bit value detected is read into a memory of the microprocessor 26 on every positive-going transition of the Moire signal, this point coinciding with the reading of the bit at substantially its mid-point. It is obviously advantageous but not essential to read the code bit at the mid-point of the information so that the contrast is at its highest value and the signal to noise ratio is at its highest value.

In this embodiment, the device has 18 bits resolution and thus has to read twenty bits of the PRC before it is able to identify the absolute position. Thus each subsequent code bit read after the first twenty identifies with the nineteen immediately preceding bits a new absolute position. The PRC is thus generated by interleaving two fragments of a maximal sequence of length $2^{(18/2+1)}-1$. Each subsequent code bit read after the first twenty identifies with the nineteen immediately preceding bits a new absolute position. Software in the microprocessor 26 thus acts on the bits as would a twenty bit, first-in, first-out, shift register.

Figure 6:
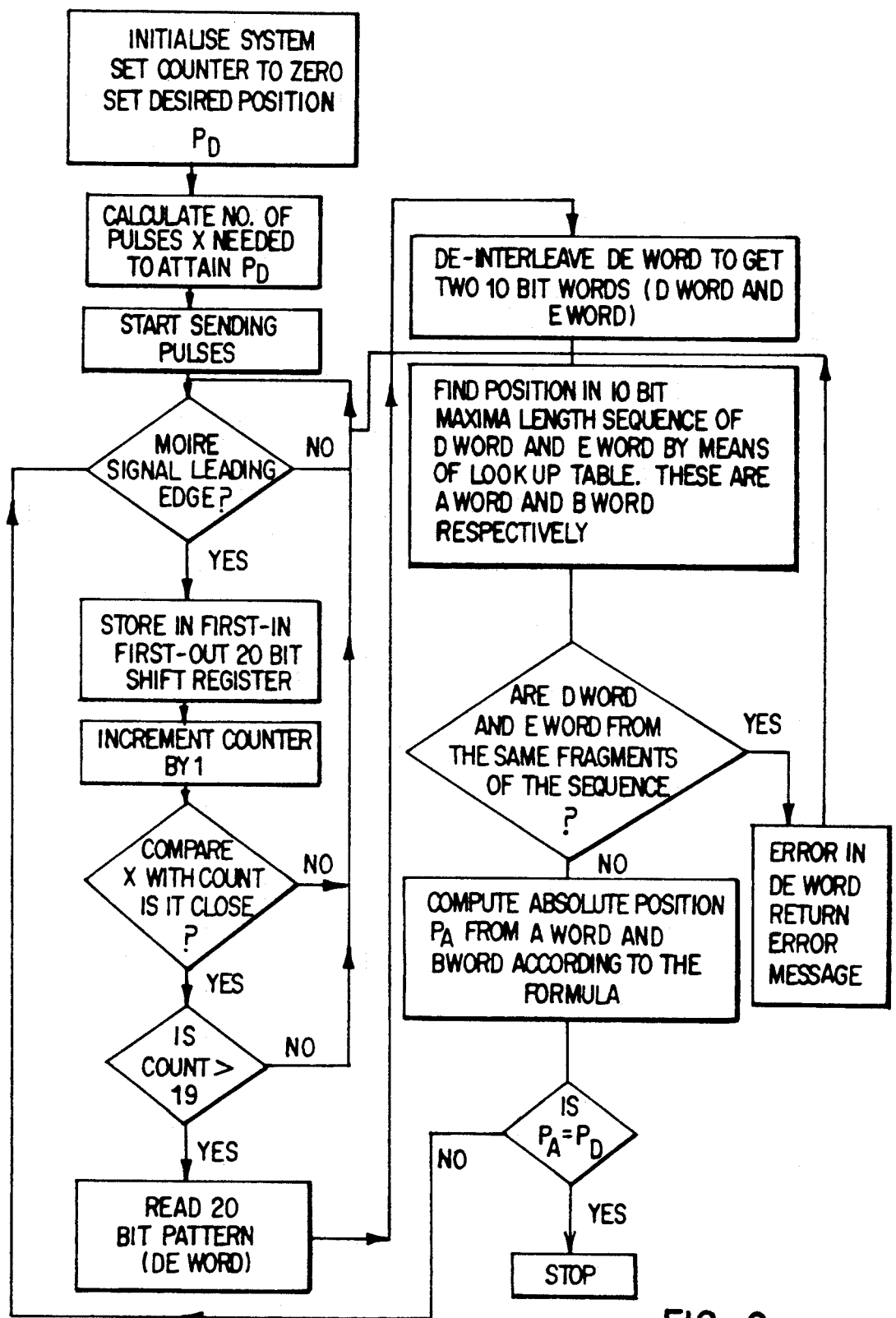
FIG. 6 shows a flowchart for a microprocessor of the arrangement of FIG. 3.

The microprocessor software causes the steps as shown in the flow chart of FIG. 6 to be carried out. This includes a software implementation of the hardware as illustrated and described with reference to FIG. 2. The first step of the software is to initialise the system, including setting the counter 32 to zero and obtaining a value for the desired position $P_D$ for the table 16. This position $P_D$ can be achieved roughly by sending a determinable number of pulses to the stepper motor 22. The microprocessor 26 calculates the number of pulses X required to attain position $P_D$ and starts sending the pulses to the stepper motor 22. The driving screw 20 then starts rotating causing the nut 18 and hence the translation table 16 to move. The reader 30 scans the Moire track to produced the Moire signal and the optical arrangement 39 starts to read the bits of the PRC. The software checks for a leading edge of the Moire signal. When the software detects a leading edge of the signal it stores the read value of the PRC bit in memory, the software simulating a first-in, first-out, 20 bit shift register. The leading edge also causes the counter 32 to increment by one. The microprocessor 26 then compares the count in the counter with X. If the two values are not close then the software goes back to the step of looking at the Moire signal. If the value in the counter is close to X, then the microprocessor 26 reads the 20 bit pattern in memory, referred to hereinafter as the DEword. The DEword is de-interleaved to get the required two ten bit words referred to as the Dword and the Eword. The respective positions of the Dword in the two fragments A and B are found by means of a look-up table in memory. These are the Aword and Bword respectively. Since each D or Eword (i.e. 10-tuple) appears only in the A or B fragment, never both, it is possible to identify from which fragment the Dword and the Eword comes from. If the Dword and Eword are from the same fragment of the sequence then this implies that there is an error in the DEword and an error signal is sent. If they are not from the same fragment of the sequence, then the absolute position $P_A$ can be computed from the Aword and Bword according to the formula as described earlier. The microprocessor 26 then compares $P_A$ with $P_D$. If the two positions coincide then the process stops or the process is repeated for a new position $P_D$. If the two positions do not coincide then the process continues until the two values are the same.

As indicated in FIG. 2, and also in FIG. 3 in dotted lines, elements of the software may be implemented in hardware. For example, with regard to the first-in-first-out shift register, there may be a leading edge detector 58 and a shift register 60 implemented in hardware and arranged as shown in dotted lines in FIG. 3. Such a hardware arrangement has the advantage of speed in some applications.

Although the above described embodiment has been described with reference to light, any form of electromagnetic radiation may be adapted to a suitably encoded strip. The coded strip may, in certain embodiments, be in the form of a magnetic tape.

I claim:

1. A carrier element for use in a positional encoder device, said carrier element having disposed thereon a code track, said code track having a sequence of bits characterized in that said sequence of bits comprises a plurality of different interleaved fragments (A1 ... AF and B1 ... BF-1) of a single maximal length sequence, said fragments having lengths with no common factors and each of said fragments being repeated in said sequence of bits such that there exists an integer x whereby any x-tuple of successive bits of the sequence of bits defines an absolute location in the sequence.

2. A carrier element as claimed in claim 1, wherein two fragments are used.

3. A carrier element as claimed in claim 2 wherein the maximal length sequence is of length $2^{(x/2)}-1$.

4. A carrier element as claimed in claim 2 or 3, wherein said fragments differ in length by 1.

5. A carrier element as claimed in claims 1, 2 or 3 in combination with means for reading successive x-tuples of the sequence.

6. A carrier element as claimed in claim 5, in combination with means for calculating an absolute location from an x-tuple read by the reading means.

7. A carrier element as claimed in claim 1, wherein in any x-tuple of x successive bits of said sequence, different bits of the x-tuple form a set of y-tuples together uniquely defining the position of the x-tuple in said sequence, each x-tuple being unique but each y-tuple occurring more than once in different x-tuples tuples such that the y-tuples of the set repeat at regular, but different, intervals in the sequence.

8. A carrier element for use in a positional encoder device, said carrier element having disposed thereon a code track, said code track having a sequence of bits characterized in that said sequence of bits comprises a plurality of different interleaved fragments (A1 ... AF and B1 ... BF-1) of a single maximal length sequence, said fragments having lengths with no common factors such that there exists an integer x whereby any x-tuple of successive bits of the sequence of bits defines an absolute location in the sequence, in combination with means for reading successive x-tuples of the sequence and with means for calculating an absolute location from an x-tuple read by the reading means, said means for calculating including means for extracting, from an x-tuple, y-tuples ($y<x$) belonging to said fragments and means for ascertaining the position of each y-tuple in its fragment.

9. A carrier element for use in a positional encoder device, said carrier element having disposed thereon a code track, said code track having a sequence of bits characterized in that said sequence of bits comprises a plurality of different interleaved fragments (A1 ... AF and B1 ... BF-1) of a single maximal length sequence, said fragments having lengths with no common factors such that there exists an integer x whereby any x-tuple of successive bits of the sequence of bits defines an absolute location in the sequence, in combination with means for reading successive x-tuples of the sequence and with means for calculating an absolute location from an x-tuple read by the reading means, said calculating means including a table in memory defining a position for each y-tuple in the fragments.

10. A carrier element for use in a positional encoder device said carrier element having disposed thereon a code track, said code track having a sequence of machine readable bits characterized in that, for a given integer x, in any x-tuple of x successive bits of said sequence, different bits of the x-tuple form a set of y-tuples together uniquely defining the position of the x-tuple in the sequence, each x-tuple being unique but each y-tuple occurring more than once in different x-tuples such that the y-tuples of the set repeat at regular, but different, intervals in the sequence.

11. A carrier element as claimed in claim 10, and including means for reading successive x-tuples of the sequence.

12. A carrier element as claimed in claim 11 and including means for defining a position for each y-tuple in a series of the y-tuples.

13. A carrier element as claimed in claim 12 wherein said means is a memory defining the position of each y-tuple.

14. A carrier element as claimed in claim 13 and including means for calculating from each position an absolute position for the x-tuple in the sequence.

15. A position control system comprising a first member; a second member movable relative to said first member; a drive means for moving said second member relative to said first member; an encoder comprising a code device coupled to one of said first member and said second member, said code device having a code track means for defining a sequence of bits having a plurality of different interleaved fragments of a single maximal length sequence, said fragments having lengths with no common factors such that there exists an integer x whereby any x-tuple of successive bits of the sequence of bits defines an absolute location in the sequences, means coupled to the other of said first member and said second member for reading successive x-tuples of the sequence to obtain data defining the relative position of said first member and said second member; and control means responsive to said data to control said drive means.

16. A method a of determining an absolute location by reference to a coded sequence disposed upon a carrier element comprising the steps of:
breaking a maximal length sequence into a plurality of fragments having lengths with no common factors;
interleaving said fragments to form a new sequence for which there exists an integer x for which any x-tuple of x successive bits of the new sequence defines an absolute location in the new sequence;
appropriately disposing said new sequence in a known position upon the carrier element;
reading an x-tuple of said new sequence; and
calculating from said x-tuple an absolute position upon the carrier element.

17. A method as claimed in claim 16 wherein the step of calculating an absolute position comprises:
de-interleaving said x-tuple to obtain sets of bits belonging to respective fragments;
finding the positions of the sets of bits in the respective fragments; and
computing an absolute position from said positions of the set of bits in the respective fragments.

18. A method as claimed in claims 16 or 17 wherein a maximal length sequence of length $2^{x/2}-1$ is broken into two fragments.

19. A method of preparing a carrier element for use in a positional encoder characterized by the steps of:
breaking a maximal length sequence into a plurality of fragments having lengths with no common factors;
interleaving said fragments to form a coded sequence; and
positioning said coded sequence in a known manner upon said carrier element.

20. A carrier element having disposed thereon a code track, said code track comprising a sequence of a plurality of interleaved fragments of the same maximal length sequence, wherein the fragments have lengths with no common factors.

21. A carrier element for use in a positional encoder device, said carrier element having disposed thereon a code track, said code track having a sequence of bits characterized in that said sequence of bits comprises a plurality of different interleaved fragments (A1 . . . AF and B1 . . . BF-1) of a single maximal length sequence, said fragments having lengths with no common factors and each of said fragments being repeated in said sequence of bits such that there exists an integer x whereby any x-tuple of successive bits of the sequence of bits defines an absolute location in the sequence, in combination with means for reading successive x-tuples of the sequence and with a means for calculating an absolute location from an x-tuple read by the reading means, said calculating means including means for extracting, from an x-tuple, y-tuples (y<x) belonging to said fragments and means for ascertaining the position of each y-tuple in its fragment, said ascertaining means including a table in memory defining a position for each y-tuple in the fragments.

* * * * *